(12) United States Patent
Scharf et al.

(10) Patent No.: US 6,506,620 B1
(45) Date of Patent: Jan. 14, 2003

(54) PROCESS FOR MANUFACTURING MICROMECHANICAL AND MICROOPTOMECHANICAL STRUCTURES WITH BACKSIDE METALIZATION

(75) Inventors: Bruce R. Scharf, Seattle, WA (US); Joel A. Kubby, Rochester, NY (US); Chuang-Chia Lin, San Pablo, CA (US); Alex T. Tran, Ithaca, NY (US); Andrew J. Zosel, Covington, WA (US); Peter M. Gulvin, Webster, NY (US); Jingkuang Chen, Rochester, NY (US)

(73) Assignees: Microscan Systems Incorporated, Renton, WA (US); Xerox Corporation, Stamford, CT (US)

( * ) Notice: Subject to any disclaimer, the term of this patent is extended or adjusted under 35 U.S.C. 154(b) by 85 days.

(21) Appl. No.: 09/724,515

(22) Filed: Nov. 27, 2000

(51) Int. Cl.[7] ............................................. H01L 21/00
(52) U.S. Cl. ........................... 438/52; 438/29; 438/32; 438/50
(58) Field of Search ............................. 438/29, 32, 50, 438/52

(56) References Cited

U.S. PATENT DOCUMENTS

| | | |
|---|---|---|
| 5,476,819 A | 12/1995 | Warren |
| 5,484,073 A | 1/1996 | Erickson |
| 5,569,355 A | 10/1996 | Then et al. |
| 5,589,083 A | 12/1996 | Ahn et al. |
| 5,645,684 A | 7/1997 | Keller |
| 5,660,680 A | 8/1997 | Keller |
| 5,853,960 A | 12/1998 | Tran et al. |
| 5,962,081 A | 10/1999 | Ohman et al. |
| 6,002,507 A | 12/1999 | Floyd et al. |
| 6,014,240 A | 1/2000 | Floyd et al. |
| 6,074,890 A | 6/2000 | Yao et al. |
| 6,084,257 A | 7/2000 | Petersen et al. |
| 6,117,344 A | 9/2000 | Cox et al. |
| 6,149,190 A | 11/2000 | Galvin et al. |
| 6,238,581 B1 | 5/2001 | Hawkins et al. |
| 6,362,512 B1 * | 3/2002 | Kubby et al. ................ 257/415 |
| 6,379,989 B1 * | 4/2002 | Kubby et al. .................. 216/24 |
| 2002/0046985 A1 * | 4/2002 | Daneman et al. .............. 216/2 |
| 2002/0050744 A1 * | 5/2002 | Bernstein et al. ............. 310/12 |

FOREIGN PATENT DOCUMENTS

| | | |
|---|---|---|
| DE | 4318466 A1 | 12/1994 |
| DE | 19603829 A1 | 8/1997 |
| JP | 410209471 A | 8/1998 |
| JP | 410290036 A | 10/1998 |

OTHER PUBLICATIONS

Bhardwaj, J.K., et al. "Advanced Silicon Etching Using High Density Plasmas," *SPIE*, vol. 2639, pp. 224–233, Oct. 1995.

Pister, K.S.J., et al. "Microfabricated Hinges," *Sensors and Actuators, A33 Eisevier Sequoia*, Mar. 4, 1992.

Lin, L.Y.,et al. "Micro–Machined Three–Dimensional Micro–Optics for Integrated Free–Space Optical System," *IEEE Photonics Technology Letters*, vol. 6, No. 12, Dec. 1994, pp. 1445–1447.

Howe, Roger T., "Surface Micromachining for Microsensors and Microactuators,"*J. Vac. Scl. Technol. B.*, vol. 6, No. 6, Nov./Dec. 1988, pp. 1809–1813.

* cited by examiner

*Primary Examiner*—Olik Chaudhuri
*Assistant Examiner*—Erik Kielin
(74) *Attorney, Agent, or Firm*—Blakely Sokoloff Taylor & Zafman LLP

(57) ABSTRACT

The present invention provides a micromechanical or microoptomechanical structure produced by a process comprising defining the structure in a single-crystal silicon layer separated by an insulator layer from a substrate layer; selectively etching the single crystal silicon layer; depositing and etching a polysilicon layer on the insulator layer, with remaining polysilicon forming mechanical elements of the structure; metalizing a backside of the structure; and releasing the formed structure.

6 Claims, 7 Drawing Sheets

PROCESS FOR MANUFACTURING MICROMECHANICAL AND MICROOPTOMECHANICAL STRUCTURES WITH BACKSIDE METALIZATION

FIELD OF THE INVENTION

Micromechanical and microoptomechanical structures fabricated on silicon-on-insulator (SOI) wafers are described. More particularly micromechanical and microoptomechanical components created by chemically and mechanically modifying SOI wafers and metalizing a backside of the components are described.

BACKGROUND

Inherent thin film properties of materials limit many surface micromachining processes. For example, variability of materials properties in polysilicon thin films (such as Young's modulus and Poisson's ratio, residual stress, and stress gradients) can prohibit manufacture of desired microstructures. This is particularly apparent in microoptical components such as mirrors, lenses, and diffraction gratings, which must be very flat for high-optical performance, and normally have to be made in the single crystal silicon layer. Since conventional surface micromachining requires that all components be made in polysilicon layers, optical performance can be limited.

The leading commercial microelectromechanical (MEMS) processing technologies are (1) bulk micromachining of single crystal silicon, and (2) surface micromachining of polycrystalline silicon. Each of these processing technologies has associated benefits and barriers. Bulk micromachining of single crystal silicon, an excellent material with well-controlled electrical and mechanical properties in its pure state, has historically utilized wet anisotropic wet etching to form mechanical elements. In this process, the etch rate is dependent on the crystallographic planes that are exposed to the etch solution, so that mechanical elements are formed that are aligned to the rate limiting crystallographic planes. For silicon these planes are the (1,1,1) crystal planes. The alignment of mechanical features to the crystallographic planes leads to limitations in the geometries that can be generated using this technique. Typical geometries include v-groove trenches and inverted pyramidal structures in (1,0,0) oriented silicon wafers, where the trenches and inverted pyramids are bound by (1,1,1) crystallographic planes. Geometries that include convex corners are not allowed unless additional measures are taken to protect etching of the crystal planes that make up the corners. The etch rate also varies with dopant concentration, so that the etch rate can be modified by the incorporation of dopant atoms, which substitute for silicon atoms in the crystal lattice. A boron dopant concentration on the order of $5 \times 10^{19}/cm^3$ is sufficient to completely stop etching, so that mechanical elements bounded by other crystal planes can be generated by using dopant "etch stop" techniques. However, dopant concentrations of this magnitude are sufficient to modify the desirable electrical and mechanical properties of the pure single crystal silicon material, leading to device design and manufacability constraints. Recent advances in Deep Reactive Ion Etching (DRIE) (see, e.g., J. K. Bhardwaj and H. Ashraf, "Advanced silicon etching using high density plasmas", Micromachining and Microfabrication Process Technology, Oct. 23–24 1995, Austin, Tex., SPIE Proceedings Vol. 2639, pg. 224) which utilize sidewall passivation and ion beam directionality to achieve etch anisotropy, have relaxed the in-plane geometric design constraints, but still require etch stop techniques to control the depth of the etch into the wafer, and additional processing steps are required to undercut a structure to release it from the substrate.

In contrast to bulk micromachining, surface micromachining of polycrystalline silicon utilizes chemical vapor deposition (CVD) and reactive ion etching (RIE) patterning techniques to form mechanical elements from stacked layers of thin films (see, e.g., R. T. Howe, "Surface micromachining for microsensors and microactuators", J. Vac. Sci. Technol. B6, (1988) 1809). Typically CVD polysilicon is used to form the mechanical elements, CVD nitride is used to form electrical insulators, and CVD oxide is used as a sacrificial layer. Removal of the oxide by wet or dry etching releases the polysilicon thin film structures. The advantage of the surface micromachining process is the ability to make complex structures in the direction normal to the wafer surface by stacking releasable polysilicon layers (see, e.g., K. S. J. Pister, M. W. Judy, S. R. Burgett, and R. S. Fearing, "Microfabricated hinges", Sensors and Actuators A33, (1992) 249 and L. Y. Lin, S. S. Lee, K. S. J. Pister, and M. C. Wu, "Micromachined three-dimensional micro-optics for free-space optical system", IEEE Photon. Technol. Lett. 6, (1994) 1445) and complete geometric design freedom in the plane of the wafer since the device layers are patterned using isotropic RIE etching techniques. An additional advantage of surface micromachining is that it utilizes thin film materials such as polysilicon, oxide, nitride, and aluminum, that are commonly used in microelectronic device fabrication, albeit with different materials properties that are optimized for mechanical rather than electrical performance. This commonality in materials allows for increased integration of microelectronic and micromechanical components into the same fabrication process, as demonstrated in Analog Devices' integrated accelerometer, and in SSI Technologies' integrated pressure sensor.

While surface micromachining relaxes many of the limitations inherent in bulk micromachining of single crystal silicon, it nonetheless has its own limitations in thin film properties. The maximum film thickness that can be deposited from CVD techniques are limited to several microns, so that thicker structures must be built up from sequential depositions. Thicker device layers are required for dynamic optical elements where dynamic deformations can impact optical performance, and for optical elements which require additional thin film coatings that can cause stress-induced curvature. The thin film mechanical properties, such as Young's modulus and Poisson's ratio, are dependent on the processing parameters and the thermal history of the fabrication process, and can typically vary by as much as 10% from run to run. This is an important limitation for robust manufacturability where these thin film mechanical properties can be a critical parameter for device performance.

An additional limitation of conventional surface micromachining is that holes through the mechanical elements must be included in the design to allow the etchants used to release the mechanical elements to reach the sacrificial layers. While this is not an important limitation for optical elements such as Fresnel lenses and diffraction grating that include holes in their design, it is an important limitation for optical elements such as mirrors where holes are a detriment to optical performance. Flatness and reflectivity are also important optical design criteria that can be impacted by conventional surface micromachining processes. Thin film stresses and stress gradients, typical of polysilicon thin films, can lead to warping of optical surfaces. In addition the surface of as-deposited polysilicon thin films is not polished, and thus requires post-processing Chemical Mechanical Polishing (CMP) techniques to obtain an optical quality surface finish.

SUMMARY OF THE INVENTION

The present invention provides a micromechanical or microoptomechanical structure produced by a process comprising defining the structure in a single-crystal silicon layer separated by an insulator layer from a substrate layer; selectively etching the single crystal silicon layer; depositing and etching a polysilicon layer on the insulator layer, with remaining polysilicon forming mechanical elements of the structure; metalizing a backside of the structure; and releasing the formed structure.

DETAILED DESCRIPTION OF THE INVENTION

Described below is an embodiment of the present inventive process and device. The embodiment illustrates only one of the several ways the present invention may be implemented. Although the embodiment is described in the context of a moving mirror on a silicon-on-insulator (SOI) chip, it could easily be used for other components. In the description that follows, like numerals represent like elements or steps in all figures. For example, if the numeral 10 is used in a figure to refer to a specific element or step, the numeral 10 appearing in any other figure refers to the same element.

Figure 1:
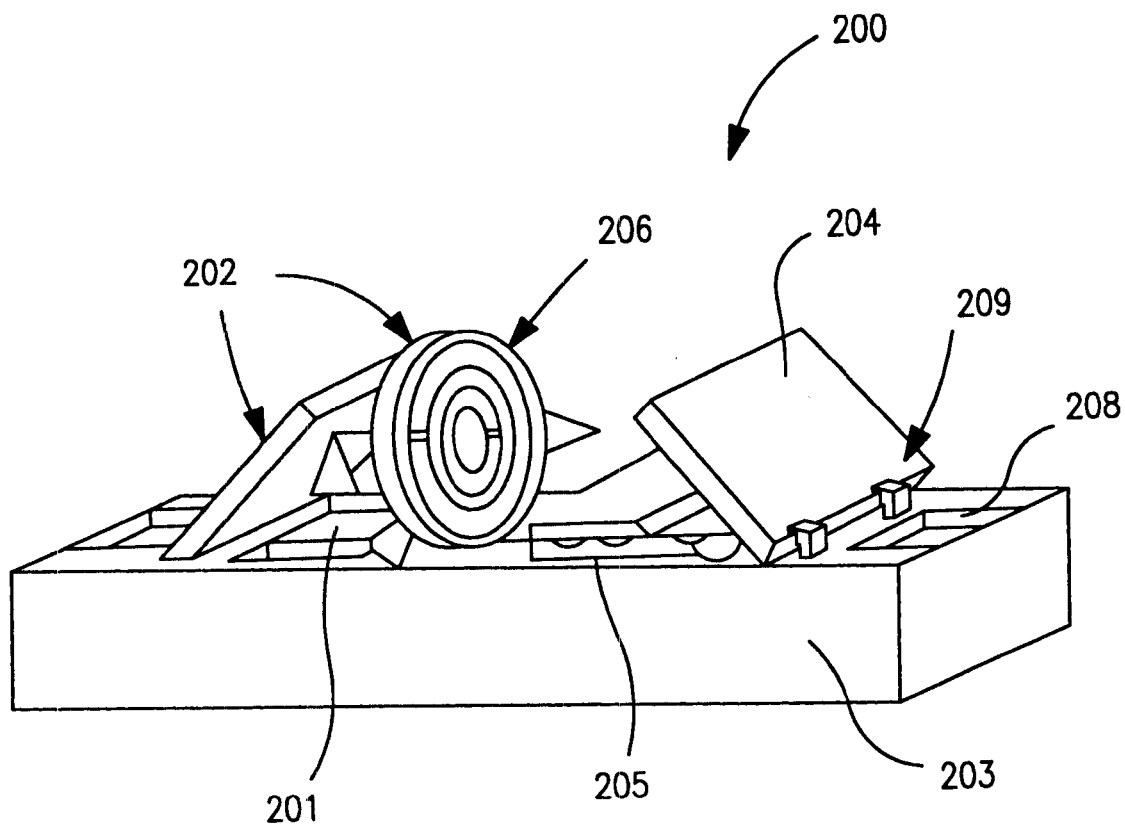
FIG. 1 illustrates in perspective view a MEMS device having various optical and mechanical elements formed in accordance with the process of the present invention.

FIG. 1 illustrates some of the very complex microelectromechanical (MEMS) and microoptoelectromechanical (MOEMS) devices that can be constructed on a silicon wafer using the embodiment of the present invention. The device 200 includes movable optical elements constructed from single crystal silicon overlaying an insulator such as a diffraction grating 202, a grating 204, and a Fresnel lens 206. Active electronic elements can also be defined in the single crystal silicon layer, including flip chip bonded light producing laser diodes 201, light detecting photodiodes 203, or conventional CMOS logic circuitry 205. Bulk modifications required for packaging or mounting of the substrate are also possible, such as illustrated by etched cavity 208, and added polysilicon layers can be used for mechanical elements such as hinges 209.

Figure 2:
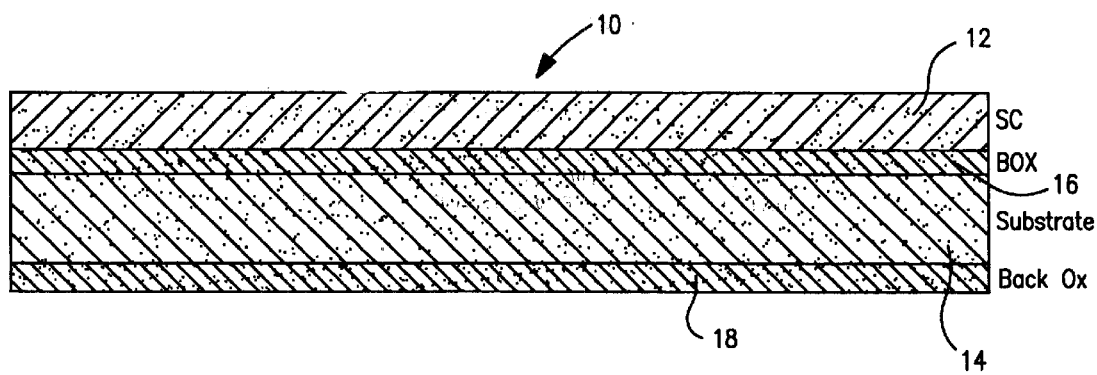
FIG. 2 is a cross-sectional view of a silicon-on-insulator (SOI) wafer in which MEMS and MOEMS devices can be created according to the present invention.

FIG. 2 shows an embodiment of a silicon-on-insulator (SOI) wafer 10 suitable for use in the embodiment of the process described herein. The SOI wafer 10 includes a thin single crystal silicon device wafer layer 12, and a substrate layer 14. The substrate layer 14 is preferably polysilicon. Between these two layers 12 and 14 there is a buried oxide (BOX) layer 16 that integrally bonds the device layer 12 and the substrate layer 14. This buried oxide layer 16 can also be used as an etch stop in wet and dry etching procedures to form a thin membrane. In addition, there is a back oxide layer 18 on the back side of the substrate layer 14, which is used to control etch down to the interface between the device layer 12 and substrate layer 14 from the backside. Preferably, the wafer is circular with a diameter of 100 mm±0.5 mm and a thickness of 525±25 microns. The overall thickness of the wafer is made up of 1±0.5 microns of backside oxide 20, 1±0.05 microns of buried oxide (BOX), and 5±0.5 microns of single crystal silicon. The remainder of the thickness is made up of the substrate.

Before beginning processing, the wafer is inspected to verify that it meets the manufacturer's specifications. If it meets the specifications, the wafer is inscribed with a lot and wafer number, cleaned, and 2000 Å of thermal oxide 20 are grown on top of the single crystal silicon layer 12 to act an etch stop in a later polysilicon etch and to prevent doping of the SCS by a later polysilicon glass (PSG) layer.

FIGS. 3–18, considered in conjunction with the following detailed steps 1–84, illustrate an embodiment of a process used on the wafer of FIG. 2 to produce the grating 204 of the microstructure 200 illustrated in FIG. 1. The process illustrated below can also be used for other types of components; it all depends on what is patterned into the wafer. The patterning of the structures on the wafer is done using standard photolithography techniques well known in the art, which typically comprise depositing layers of the correct materials on the wafer, applying a photoresist on the wafer, exposing the photoresist in areas to be added (light mask) or removed (dark mask) and then performing the appropriate etch.

| Step # | Process | Comments |
|---|---|---|
| 1. | Thermal oxidation | 1000° C., 2000 Å |
| 2. | Photolithography Mask # 1: Substrate__Contact | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm$^2$, 12 sec<br>f) develop MF 319, 1.1 min<br>g) rinse, DI water, 4 min<br>h) spin dry<br>i) hardbake 110 degrees C., 30 min |
| 3. | Oxide etch | RIE: CF$_4$, target etch rate: 2500 Å/min |
| 4. | SCS etch | RIE: HBr, Cl$_2$, target etch rate: 2500 Å/min |
| 5. | Oxide etch | RIE: CF$_4$, target etch rate: 2500 Å/min |
| 6. | Strip photoresist | Hot PRS2000, 20 min<br>rinse DI water, 5 min<br>spin, dry |
| 7. | Photolithography Mask # 2: SCS__Dimple | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm$^2$, 12 sec<br>f) develop MF 319, 1.1 min<br>g) rinse, DI water, 4 min<br>h) spin dry<br>i) hardbake 110 degree C., 30 min |
| 8. | Oxide etch | RIE: CF$_4$, target etch rate: 2500 Å/min |
| 9. | SCS etch | RIE: HBr, Cl$_2$, target etch rate: 5000 Å/min |
| 10. | Oxide etch | RIE: CF$_4$, target etch rate: 2500 Å/min |
| 11. | Strip photoresist | Hot PRS2000, 20 min<br>rinse DI water, 5 min<br>spin, dry |
| 12 | Polysilicon deposition | LPCVD, 3 μm |
| 13. | Polysilicon etch | RIE: HBr, Cl$_2$, target etch rate: 5000 Å/min |
| 14. | Oxide etch | RIE: CF$_4$, target etch rate: 2500 Å/min |
| 15. | Photolithography Mask # 3: SCS__Grating | a) bake 110 degree C., 15 min<br>b) HMDS, 5.OK, 30 sec<br>c) AZ1813, 4.OK, 30 SEC, 1.3 um<br>d) softbake 90 C., 30 min |

-continued

| Step # | Process | Comments |
|---|---|---|
| | | e) expose, 5.0 mW/cm², 12 sec |
| | | f) develop MF 319, 1.1 min |
| | | g) rinse, DI water 4 min |
| | | h) spin dry |
| | | i) hardbake 110 degree C., 30 min |
| 16. | SCS etch | RIE: HBr, Cl₂, target etch rate: 5000 Å/min |
| 17. | Strip photoresist | Hot PRS2000, 20 min<br>rinse DI water, 5 min<br>spin, dry |
| 18. | Photolithography<br>Mask # 4:<br>SCS_Hole | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm², 12 sec<br>f) develop MF 319, 1.1 min<br>g) rinse, DI water, 4 min<br>h) spin dry<br>i) hardbake 110 degree C., 30 min |
| 19 | SCS etch | RIE: HBr, Cl₂, target etch rate: 5000 Å/min |
| 20. | Strip photoresist | Hot PRS2000, 20 min<br>rinse DI water, 5 min<br>spin, dry |
| 21. | TEOS deposition | LPCVD, 8 μm |
| 22. | Densification | 800° C., 1 hour |
| 23. | CMP | Leave 2 +/− 0.2 μm |
| 24. | Photolithography<br>Mask # 5:<br>Anchor_SCS | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm², 12 sec<br>f) develop MF 319, 1.1 min<br>g) rinse, DI water, 4 min<br>h) spin dry<br>i) hardbake 110 degree C., 30 min |
| 25. | Oxide etch | RIE: CF₄, target etch rate: 2500 Å/min |
| 26. | Strip photoresist | Hot PRS2000, 20 min<br>rinse DI water, 5 min<br>spin, dry |
| 27. | Nitride deposition | LPCVD, 6000 Å |
| 28. | Photolithography<br>Mask # 6:<br>Nitride_Struct | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm², 12 sec<br>f) develop MF 319, 1.1 min<br>g) rinse, DI water, 4 min<br>h) spin dry<br>i) hardbake 110 degree C., 30 min |
| 29. | Nitride etch | RIE: CF₄, target etch rate: 2500 Å/min |
| 30. | Strip photoresist | Hot PRS2000, 20 min<br>rinse DI water, 5 min<br>spin, dry |
| 31. | Polysilicon deposition | LPCVD, 5000 Å |
| 32. | Photolithography<br>Mask # 7:<br>Poly0_Struct | a) bake 110 degree C., 15 min<br>b) HMDS, 5.OK, 30 sec<br>c) AZ1813, 4.OK, 30 SEC, 1.3 um<br>d) softbake 90 C. 30 min<br>e) expose, 5.0 mW/cm², 12 sec<br>f) develop MF 319, 1.1 min<br>g) rinse, DI water, 4 min<br>h) spin dry<br>i) hardbake 110 degree C., 30 min |
| 33. | Backside polysilicon strip | RIE: SF₆, O₂ |
| 34. | Polysilicon etch | RIE: HBr, Cl₂, target etch rate: 5000 Å/min |
| 35. | Strip photoresist | Hot PRS2000, 20 min<br>rinse DI water, 5 min<br>spin, dry |
| 36. | PSG deposition | PECVD, 2 μm |
| 37. | Photolithography<br>Mask # 8:<br>Poly1_Dimple | a) bake 110 degree C., 15 min<br>b) HMDS, 5.OK, 30 sec<br>c) AZ1813, 4.OK. 30 SEC, 1.3 um<br>d) softbake 90 C., 30 min<br>e) expose, 5.0 mW/cm², 12 sec<br>f) develop MF 319, 1.1 min<br>g) rinse, DI water, 4 min<br>h) spin dry<br>i) hardbake 110 degree C., 30 min |
| 38. | Oxide etch | RIB: CF₄, target etch rate: 2500 Å/min |
| 39. | Strip photoresist | Hot PRS2000, 20 min<br>rinse DI water, 5 min<br>spin, dry |
| 40. | Photolithography<br>Mask # 9:<br>PSGI_Hole | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm², 12 sec<br>f) develop MF 319, 1.1 min<br>g) rinse, DI water, 4 min<br>h) spin dry<br>i) hardbake 110 degree C., 30 min |
| 41. | Oxide etch | RIB: CF₄, target etch rate: 2500 Å/min |
| 42. | Strip photoresist | Hot PRS2000, 20 min<br>rinse DI water, 5 min<br>spin, dry |
| 43. | Polysilicon deposition | LPCVD, 2 μm |
| 44. | PSG deposition | PECVD, 2000 Å |
| 45. | Anneal | 1000° C., 1 hour |
| 46. | Backside polysilicon strip | RIE: SF₆, O₂ |
| 47. | Photolithography<br>Mask # 10:<br>Poly1_Struct | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm², 12 sec<br>f) develop MF 319, 1.1 min<br>g) rinse, DI water, 4 min<br>h) spin dry<br>i) hardbake 110 degree C., 30 min |
| 48. | Oxide etch | RIE: CF₄, target etch rate: 2500 Å/min |
| 49. | Polysilicon etch | RIB: HBr, Cl₂, target etch rate: 5000 Å/min |
| 50. | Strip photoresist | Hot PRS2000, 20 min<br>rinse DI water, 5 min<br>spin, dry |
| 51. | Oxideetch | RIE: CF₄, target etch rate: 2500 Å/min |
| 52. | Oxide deposition | PECVD, 7500 Å |
| 53. | Photolithography<br>Mask # 11:<br>PSG2_Hole | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm², 12 sec<br>f) develop MF 319, 1.1 min<br>g) rinse, DI water, 4 min<br>h) spin dry<br>i) hardbake 110 degree C., 30 min |
| 54. | Oxide etch | RIB: CF₄, target etch rate: 2500 Å/min |
| 55. | Strip photoresist | Hot PRS2000, 20 min<br>rinse DI water, 5 min<br>spin, dry |
| 56. | Photolithography<br>Mask # 12:<br>PSG2_PSG2_Hole | a) bake 110 degree C., 15 min<br>b) HMDS, 5 OK 30 sec<br>c) AZ1813, 4.OK, 30 SEC, 1.3 um<br>d) softbake 90 C., 30 min<br>e) expose, 5.0 mW/cm², 12 sec<br>f) develop MF 319, 1.1 min<br>g) rinse, DI water, 4 min<br>h) spin dry<br>i) hardbake 110 degree C., 30 min |
| 57. | Oxide etch | RIE: CF₄, target etch rate: 2500 Å/min |
| 58. | Strip photoresist | Hot PRS2000, 20 min<br>rinse DI water, 5 min<br>spin, dry |

-continued

| Step # | Process | Comments |
|---|---|---|
| 59. | Polysilicon deposition | LPCVD, 1.5 μm |
| 60. | Oxide deposition | PECVD, 2000 Å |
| 61. | Anneal | 1000° C., 1 hour |
| 62. | Photolithography Mask # 13: Poly2_Struct | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm$^2$, 12 sec<br>f) develop MF 319, 1.1 min<br>g) rinse, DI water, 4 min<br>h) spin dry<br>i) hardbake 110 degree C., 30 min |
| 63. | Backside polysilicon strip | RIE: SF$_6$, O$_2$ |
| 64. | Oxide etch | RIE: CF$_4$, target etch rate: 2500 Å/min |
| 65. | Polysilicon etch | RIE: HBr, Cl$_2$, target etch rate: 5000 Å/min |
| 66. | Oxide etch | RIE: CF$_4$, target etch rate: 2500 Å/min |
| 67. | Strip photoresist | Hot PRS2000, 20 min<br>rinse DI water, 5 min<br>spin, dry |
| 68. | Oxide etch | RIE: CF$_4$, target etch rate: 2500 Å/min |
| 69. | Photolithography Mask # 14: SCS_Expose | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm$^2$, 12 sec<br>f) develop MF 319, 1.1 min<br>g) rinse, DI water, 4 min<br>h) spin dry<br>i) hardbake 110 degree C., 30 min |
| 70. | Oxide etch | HF |
| 71. | Photolithography Mask # 15: Thick_Metal | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm$^2$, 12 sec<br>f) develop MF 319, 1.1 min<br>g) rinse, DI water, 4 min<br>h) spin dry<br>i) hardbake 110 degree C., 30 min |
| 72. | Metal evaporation | Cr/Au: 300 Å/5000 Å |
| 73. | Lift-off | Hot 1112A |
| 74. | Photolithography Mask # 16: Thin_Metal | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm$^2$, 12 sec<br>f) develop MF 319 1.1 min<br>g) rinse, DI water, 4 min<br>h) spin dry<br>i) hardbake 110 degree C., 30 min |
| 75. | Metal evaporation | Cr/Au: 200 Å/300 Å |
| 76. | Lift-off | Hot 1112A |
| 77. | Photolithography Mask # 17: Back | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm$^2$, 12 sec<br>f) develop MF 319, 1.1 min<br>g) rinse, DI water, 4 min<br>h) spin dry<br>i) hardbake 110 degree C., 30 min |
| 78. | Nitride etch | RIE: CF$_4$, target etch rate: 2500 Å/min |
| 79. | Oxide etch | RIE: CF$_4$, target etch rate: 2500 Å/min |
| 80. | Protect front side | Spin-on coat (proprietary) |
| 81. | Strip photoresist (backside) | Hot PRS2000, 20 min<br>rinse DI water, 5 min<br>spin, dry |
| 82. | KOH etch | 45%, 65–85° C. |
| 83. | Nitride etch | RIE: CF$_4$, target etch rate: 2500 Å/min |
| 84. | Oxide etch | RIE: CF$_4$, target etch rate: 2500 Å/min |

Figure 3:
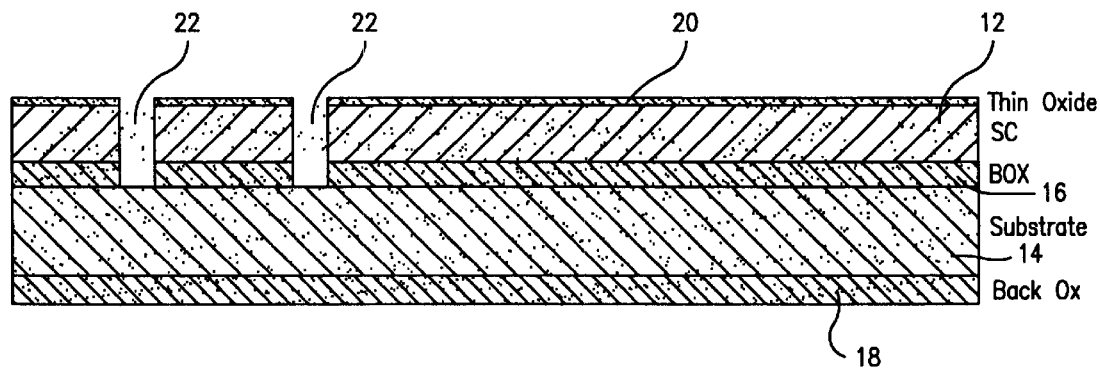
FIGS. 3–18 show an embodiment of process steps used to form a MEMS device such as those illustrated in FIG. 1.

FIG. 3 illustrates the wafer at the conclusion of step 6. Substrate contact holes 22 about 4 microns wide are patterned onto the SCS layer 12 of the wafer. A reactive ion etch (RIE) of the thermal oxide 20 is performed, and the SCS layer 12 is etched through to the buried oxide 16, also using a reactive ion etch. The photoresist used to pattern the holes 22 is left on to protect the rest of the oxide 20, and an RIE etch of the exposed buried oxide 16 is performed 1 micron down. This etches the BOX layer 16 away and leaves the substrate layer 14 exposed at the bottom of the contact holes 22.

Figure 4:
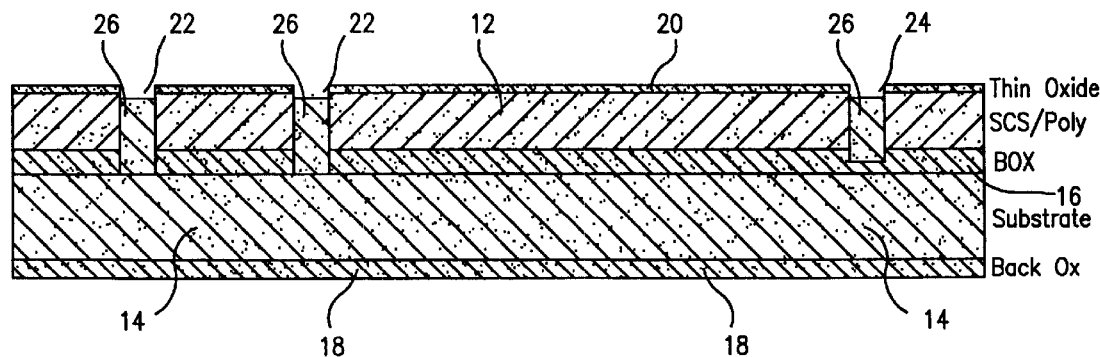

FIG. 4 illustrates the state of the wafer at the conclusion of step 14. SCS dimple holes 24 4 microns wide are patterned onto the SCS layer 12 and an RIE etch of the thermal oxide 20 is performed, followed by an RIE etch of the SCS layer 12 through to the BOX layer 16. The photoresist is left on to protect the rest of the thermal oxide 20 and an RIE etch of the exposed BOX layer 16 is performed until about half the thickness of the BOX layer is etched away. The photoresist is removed and polysilicon 26 is deposited to fill the dimple 24 and substrate contact holes 22. In this embodiment, 2.5 microns of polysilicon should be enough, since the dimples 24 and substrate contacts 22 are 4 microns wide. The polysilicon 26 is etched with an RIE using the thermal oxide 20 as an etch stop. This removes the polysilicon 26 from everywhere except in the dimple and substrate contact holes, where the level of the polysilicon will be lower than the rest of the wafer, depending on the amount of polysilicon overetch.

Figure 5:
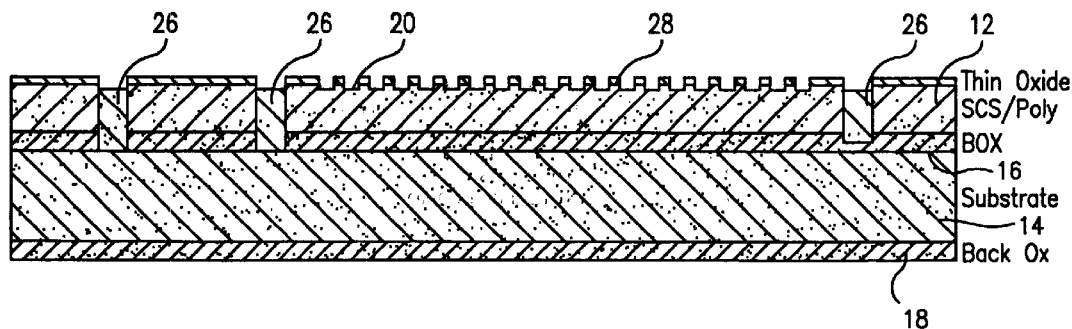

FIG. 5 illustrates the state of the wafer at the conclusion of step 17. A pattern in the form of a grating 28 is first applied to the SCS layer 12. The grating 28 must be applied to the wafer at this early stage of processing. Optimum focusing of the applied mask is needed because the line spacing of the grating is of the same order as the wavelength of light, meaning that the resolution must be as good as possible. To assure optimum focus, the grating 28 must be applied to the wafer when there is little or no topography already built up. This ensures that there are no problems with depth of focus that would affect the quality of the resulting grid. In addition, applying the grid while there is minimum topography on the wafer ensures that there is no adverse effects from shadows cast by topographical features that are present. Once the grating 28 is patterned on the wafer, a quick RIE oxide etch is then performed to remove the thermal oxide 20, followed by a 3 micron RIE etch of the SCS layer 12. The photoresist used to apply the grating 28 is then removed.

Various types of gratings 28 can be applied to the SCS layer 12; the exact type of grid will depend on the application of the particular micromechanical or microoptomechanical device. Examples of gratings include a Fresnel pattern useful for reflective optical applications; a uniform square grating useful for light frequency division in applications such as a spectrum analyzer; and a variable pitch grid where sets of lines in the grating are spaced in variable increments to achieve better spectral coverage of certain wavelengths and enhance optical power. Different gratings may also be used for other optical purposes, such as a crystal oscillator which changes resonance based on surface effects, or for non-optical purposes such as chemical or biological sensors, where the grating increases the available surface area for chemical or biological binding.

Figure 6:
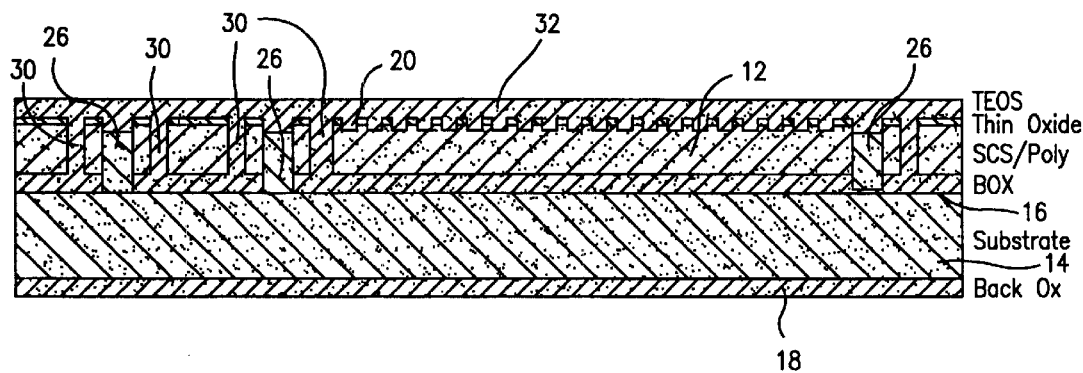

FIG. 6 illustrates the wafer at the conclusion of step 23. The SCS layer 12 is patterned with full-depth features 30, and a quick RIE etch is performed to remove the thermal oxide 20. A chlorine-based RIE etch is performed all the way through the SCS layer 12, using the BOX layer 16 as an etch stop. 0.2 microns of undoped, low pressure chemical vapor deposition (LPCVD) oxide (not shown) are deposited to protect the sidewalls of the full-depth features 30. Six (6) microns of planarization oxide (POX) 32 are deposited so that the wafer will be flat after later chemical mechanical polishing (CMP); the planarization oxide 32 is preferably boron polysilicate glass (BPSG) or thermally enhanced oxide (TEOS). A timed chemical mechanical polish of the POX 32 is performed until 2±0.2 microns of the planarization oxide 32 remain on the SCS layer 12.

Figure 7:
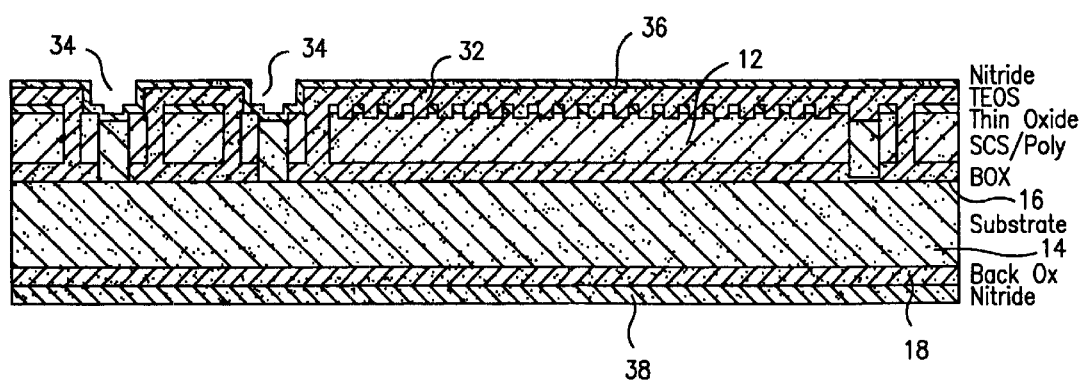

FIG. 7 illustrates the wafer at conclusion of step 27. A pair of holes 34 are patterned in the POX layer 32, and an RIE etch is performed to transfer the pattern into the POX 32 and down to the SCS layer. The photoresist is removed and a nitride layer 36 with a thickness of 0.6 microns is deposited via LPCVD. A second nitride layer 38 is also deposited on the back of the wafer for extra selectivity during a later potassium hydroxide (KOH) etch.

Figure 8:
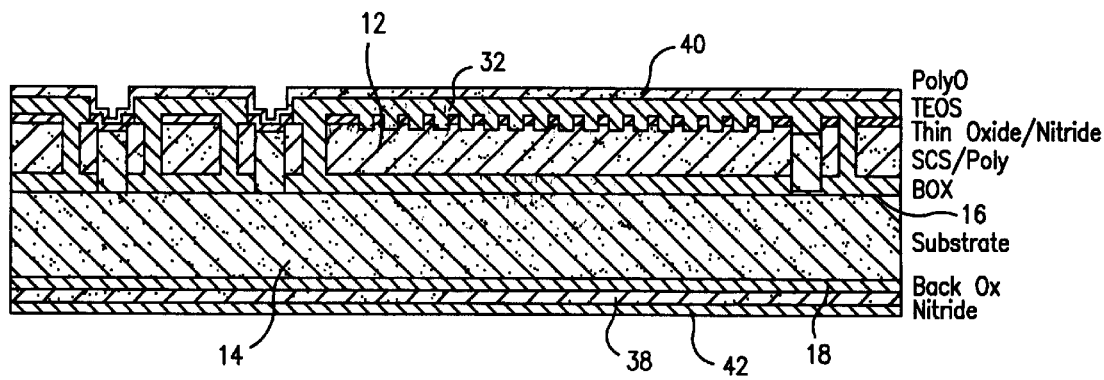

FIG. 8 illustrates the wafer at the conclusion of step 31. The resist on the pattern front side is patterned with nitride structures and the pattern is transferred to the front nitride layer 36 using an RIE etch. A layer of LPCVD polysilicon 40 is deposited on the front, and a similar layer 42 is applied to the back of the wafer; both layers are 0.5 microns thick.

Figure 9:
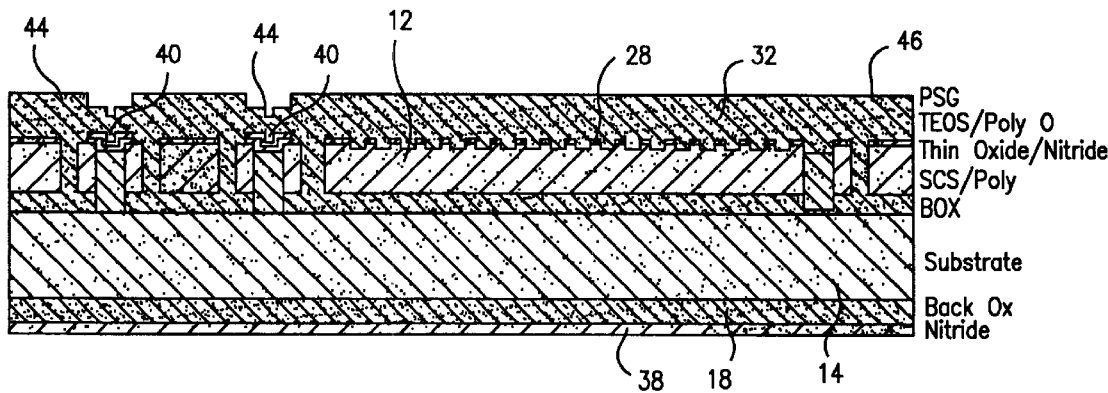

FIG. 9 illustrates the wafer at the conclusion of step 36. The front side of the wafer is patterned with polysilicon structures 44 and then RIE etched to transfer the pattern to the polysilicon layer 40. The photoresist is left on, the wafer is flipped and another layer of polysilicon (not shown) is deposited on the backside and RIE etched. The wafer is flipped again and the front side resist is removed, which is acting as a protective layer for the front side when flipped. A layer of PECVD polysilicon glass (PSG) 46 is added to the front of the waver and densified to 2 microns.

Figure 10:
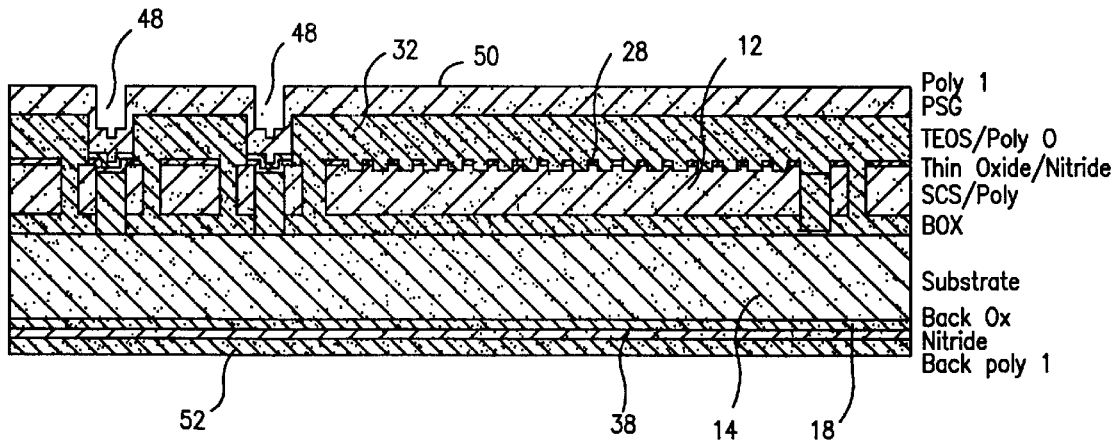

FIG. 10 illustrates the wafer after step 46. Holes 48 are patterned in the PSG layer 46 and an RIE etch is done to transfer the pattern to the PSG layer using the polysilicon layer 40 as an etch stop. The photoresist is removed and a front layer 50 and back layer 52 of LPCVD polysilicon 2 microns thick are deposited, followed by a deposit of 0.2 microns of PECVD polysilicon glass (PSG) (not shown), and the wafer is annealed at 1,000° C. for one hour to dope the polysilicon layers 50 and 52 and reduce stress.

Figure 11:
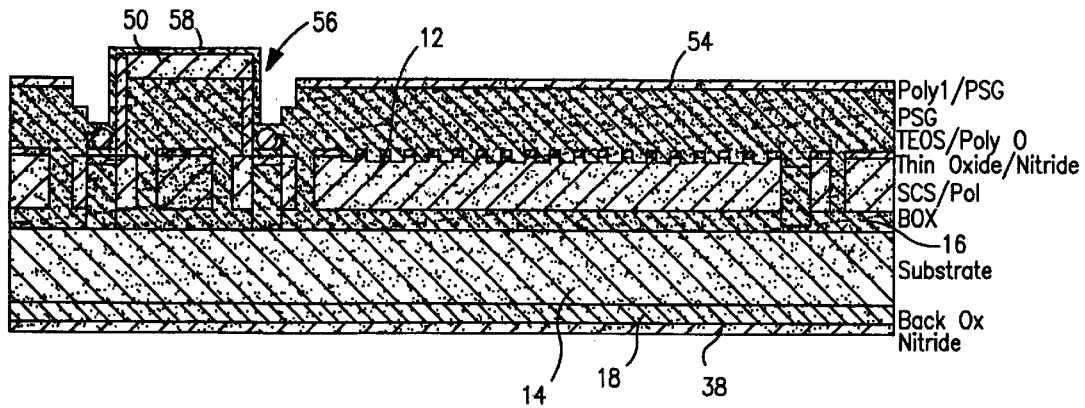

FIG. 11 illustrates the wafer at the conclusion of step 52. This PSG layer 46 is patterned with polysilicon structures 56, and an RIE etch is performed to transfer the pattern to a PSG hard mask, followed by an RIE etch to transfer the pattern to the polysilicon layer 50. The resist is left on and the wafer is flipped and RIE etched to remove the backside polysilicon 52, using the front side resist and hard mask to protect the front. The wafer is flipped back over when done, the photoresist is removed, and the hard mask is removed with an RIE etch, which thins any exposed oxide by about 0.3 microns. A layer of PECVD polysilicon glass (PSG2) 54, is deposited and densified to 0.75 microns.

Figure 12:
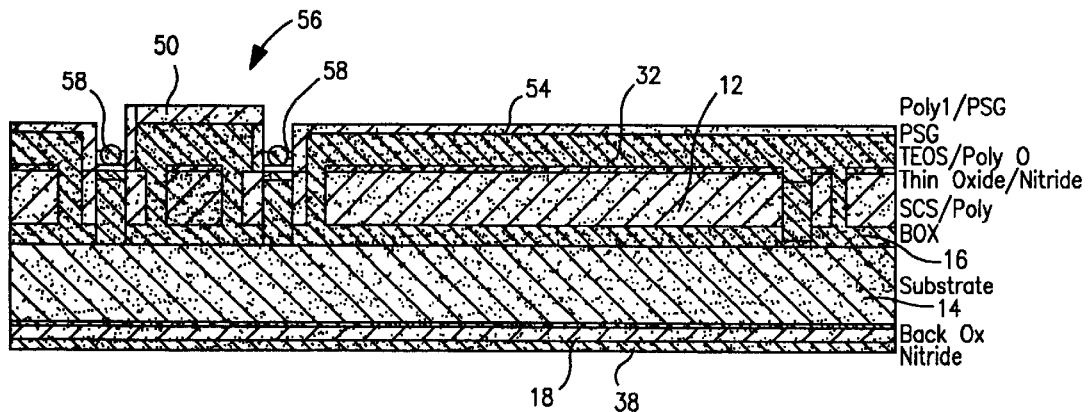

FIG. 12 illustrates the wafer at the conclusion of step 55. Holes 58 are patterned in the PSG2 layer 54 and an RIE etch is performed to transfer the pattern to the PSG, using the polysilicon layer as an etch stop. The photoresist is then removed.

Figure 13:
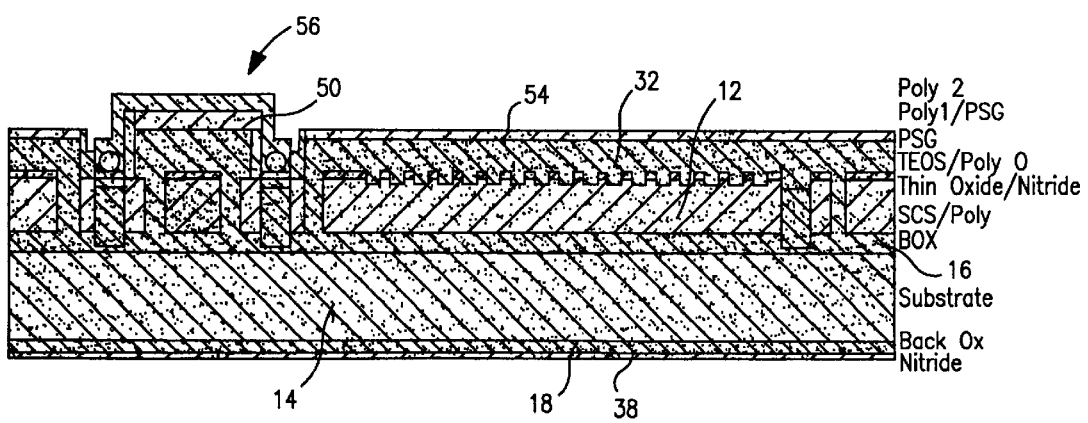

FIG. 13 illustrates the wafer at the conclusion of step 68. The thermal oxide layer 20 is patterned with polysilicon structures and an RIE etch is performed to transfer the pattern to the PSG hard mask. An RIE etch is performed to transfer the pattern to the polysilicon 50. The wafer is flipped and an RIE etch is performed to remove the backside polysilicon, using the front side resist and hard mask to protect the front. The resist is removed, and the hard mask is removed with an RIE etch.

Figure 14:
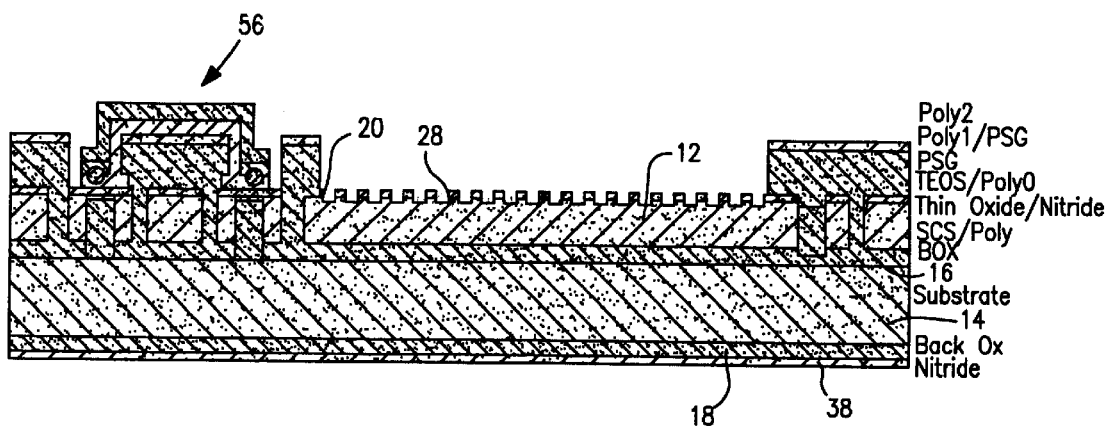

FIG. 14 illustrates the wafer at the conclusion of step 70. Areas on the front side where the POX 32 should be removed are patterned. This layer should only be used in areas where there is no polysilicon or metal, since those would act as etch stops for the subsequent etches. A wet etch is performed to remove the thermal oxide layer 20, exposing selected areas of the SCS layer 12. Designers must be careful that the nearby structures aren't damaged by a hydrofluoric acid (HF) etch. Polysilicon layers previously put on the SCS layer can be etched away without etching any of the SCS layer because the SCS layer 12 itself creates an etch stop.

Exposure of selected areas of the SCS layer at this point in the process allows mechanical, electrical and optical structures to be built directly onto the selected areas after other important structural (i.e., non-sacrificial) features have been built onto the SCS. These mechanical, electrical and optical structures are thus better able to take advantage of the SCS layer's useful properties. In the embodiment shown, a metal coating 60 is applied directly onto the grating 28 previously etched into the SCS layer 12 (see FIG. 15). Application of the metal coating 60 turns the grating 28 into a reflecting grating. Similarly, metal elements can be put on the SCS layer to conduct electrical current, insulating elements can be built on the SCS using nitride or oxide layers, or elements comprising both conducting and insulating parts can be built onto the SCS layer.

Figure 15:
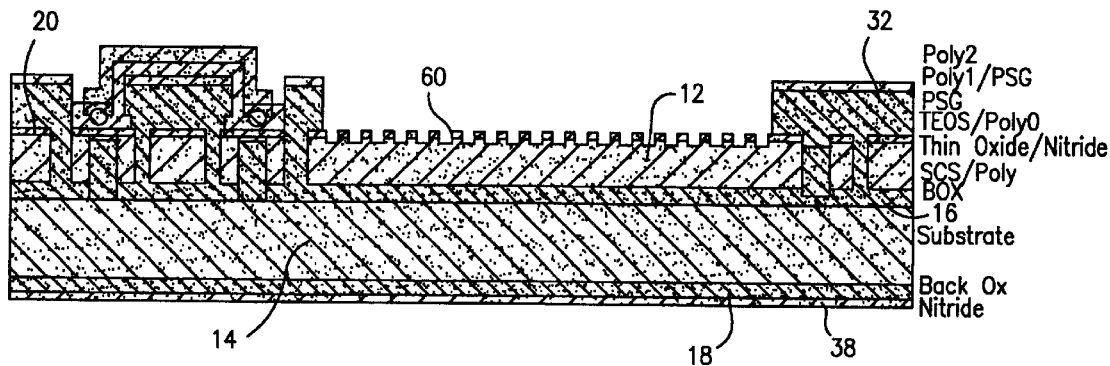

FIG. 15 illustrates the wafer at the conclusion of step 76. A photoresist is patterned for lift-off metal and 0.5 microns of metal 60 are deposited on the grating 28 on the front side of the SCS layer 12. The resist is lifted off, removing metals in those areas. A pattern is applied with areas where metal should be removed, and 200 Å of chromium (Cr) are deposited on the front side of the grating 28, followed by 300 Å of gold (Au). In this case, the gold increases the reflectivity of the grating, and because of how it is deposited it also smoothes the edges of the grating. Other metals having required reflectivity may also be used on the grating 28; examples include aluminum (Al) and platinum (Pt). The resist and the metal coating resist are then removed.

Figure 16:
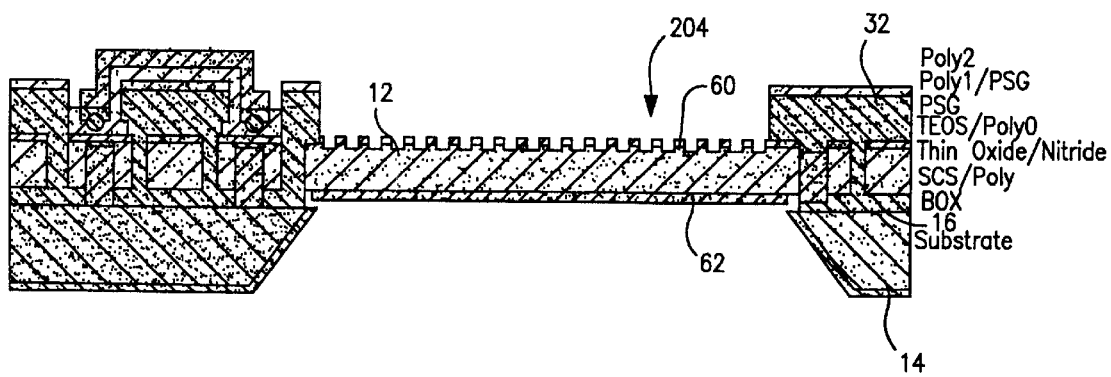

FIG. 16 illustrates the wafer at the conclusion of step 84. The backside nitride/oxide layer 38 is patterned with holes sized so that KOH will etch the desired depth. Uncertainty in wafer thickness will affect the size of the holes created at the other side of the wafer. The pattern is transferred to the nitride layer 38 with an RIE etch, and the same pattern is also transferred to the oxide layer 18 with an RIE etch. A through-wafer KOH etch is performed while protecting the front side with a deposited layer. If a coating is used it should be left on for the next step which involves removing the backside nitride/oxide using a nitride RIE etch and then an oxide RIE etch, which clears off exposed buried SCS. The protective layer possibly present from the last step will protect the front side. Backside etching of the wafer 10 is possible because in this process because of the use of different materials for the substrate layer 14 (which is made of polysilicon) and the device layer 12 (made of single crystal silicon). This enables the substrate to be etched away without etching away the backside of the device layer, and allows both sides of the device layer to be used to make various components mechanical and optical components such as the two-sided mirror shown.

To make the two-sided grating 204, a blanket deposit of 0.1 microns of metal 62 is deposited on the backside of the wafer to metalize the backside of the mirror. The metal is sputtered onto the backside of the wafer; suitable metals for metalization of the backside include all the metals used on the front layer 60. If the component whose backside is to be metalized has holes which extend through the device layer, the backside metal must be deposited carefully to ensure that the metal does not flow through the holes and ruin the quality of the front surface of the device. This is particularly important with optical components, where the front surface must have near-perfect optical qualities and no flow-through from back to front can be tolerated. An effective way of addressing this problem of metal flowing through to the front surface is to tilt the wafer while the metal is sputtered onto the backside; this prevents flow-through of the metal. Any exposed holes in the SCS layer 12 must be kept small (approximately 2 microns) to prevent sputtered metal from traveling all the way through the wafer. The same technique can be used when sputtering metal on the front side of the wafer if a two-sided optical component is needed.

Metalization of the backside of a component such as the grating 204 has several advantages. Among other things, the backside metalization helps with the release of the component once it's finished. When used on a one-sided optical device such as a mirror, backside metalization reduces transmission of light through the mirror. Backside metalization also helps ensure that any residual stresses in the mirror are balanced, so that the grating 204 will not become distorted. Finally, backside metalization allows two-sided optical components to be made.

Figure 17:
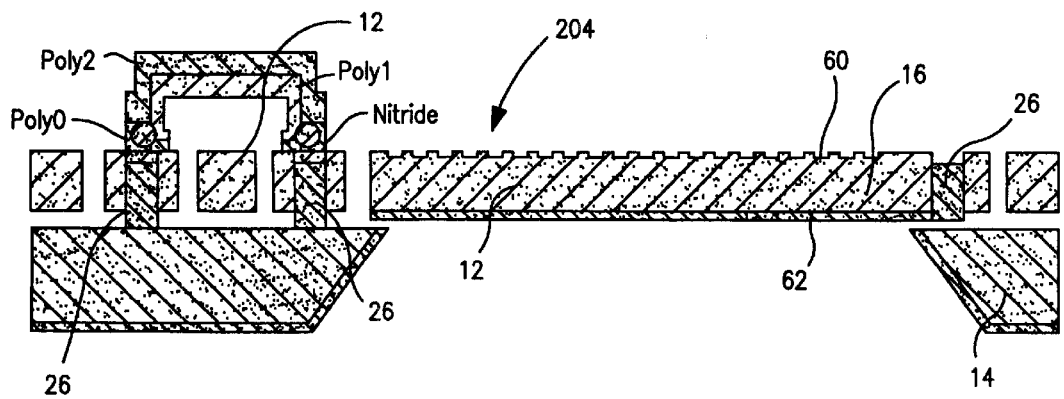
Figure 18:
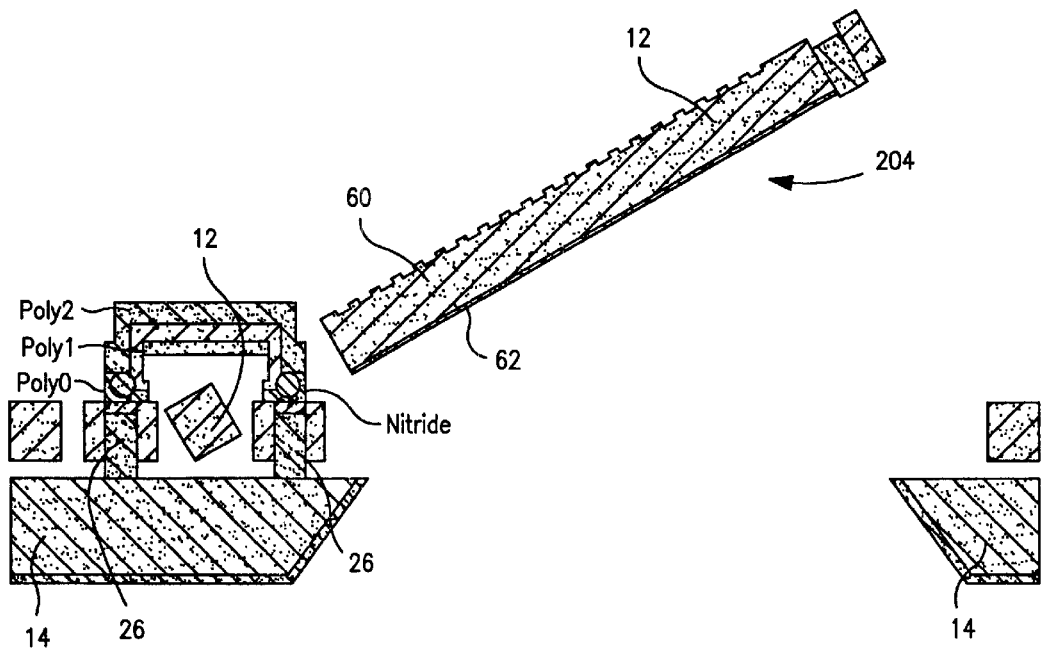

FIGS. 17 and 18 illustrate the wafer at the conclusion of the process after the grating 204 built into the wafer has been released. The release may be performed by any of various methods including standard MUMPS methods which include (1) stripping the photoresist by soaking in acetone for 20 to 30 minutes with mild agitation, (2) etching in 49% straight HF for 2½ to 3 minutes and rinsing in de-ionized water for 10 minutes, or (3) rinse in IPA for 5 minutes and bake the chip at 100–110° C. for 10 to 15 minutes.

Since the fabrication technology utilized to produce microoptoelectromechanical (MOEMS) components can lead to manufacturing barriers in the thin film properties associated with the process, the present invention includes an enabling fabrication process for microoptoelectromechanical systems that overcomes the barriers in the optomechanical properties of thin film structures. The key innovation to overcoming these thin film properties is to utilize silicon on insulator (SOI) wafers as the starting substrate in a surface micromachining process (see FIG. 1). SOI is a generic term that refers to a structure in which a silicon layer is supported by a dielectric material. In this embodiment, a silicon device layer, bonded to a conventional silicon handle wafer, has a SiO$_2$ thin-film layer at the interface. This allows critical optical and electronic components to be fabricated in a single crystal silicon device layer, which can be released from the handle wafer by etching the oxide at the interface between the device layer and the substrate.

The oxide layer at the interface can also be utilized as a backside etch stop layer for releasing optical components, such as a mirror, that cannot include etch holes. The device layer has a user specified thickness that is appropriate for the given application, and has excellent and reproducible electrical and thin film properties. Both the back and front side of the device layer would be polished, and thus optical elements fabricated in this layer do not require additional post-processing chemical-mechanical polish (CMP) techniques to obtain an optical quality surface finish. Since the device layer is single crystal silicon, it has no intrinsic stress or stress gradients in the absence of thin film coatings. Since it can be made thicker than conventional chemical vapor deposition (CVD) deposited thin films, optical components fabricated in this layer have minimal distortions after thin film depositions such as aluminum to increase surface reflectivity, or dielectric thin films to decrease surface reflectivity. The additional thickness is also important to minimize distortions for dynamically actuated optical elements.

As those skilled in the art will appreciate, other various modifications, extensions, and changes to the foregoing disclosed embodiments of the present invention are contemplated to be within the scope and spirit of the invention as defined in the following claims.

What is claims is:

1. A process for making a micromechanical or microoptomechanical structure in a wafer comprising a single crystal silicon layer bonded to a substrate layer by an insulator layer, the process comprising:
   defining the structure in the single-crystal silicon layer;
   selectively etching the single crystal silicon layer;
   photolithographically patterning and etching the selectively etched single crystal silicon layer and the insulator layer,
   depositing and patterning a polysilicon layer on the insulator layer;
   metalizing a backside of the structure; and
   releasing the structure.

2. The process of claim 1 wherein selectively etching the single crystal silicon further comprises the step photolithographically patterning and dry etching the single crystal silicon layer.

3. The process of claim 1 wherein the insulator layer is an oxide layer.

4. The process of claim 1 wherein metalizing the backside of the structure comprises:
   etching the substrate layer and insulator away from a backside of the wafer until a backside of the single crystal silicon layer of the structure is exposed; and
   depositing a coating of metal on the exposed backside of the single crystal silicon layer of the structure.

5. The process of claim 4 wherein the metal is selected from the group consisting of gold, aluminum, chromium and platinum.

6. The process of claim 1 further comprising:
   depositing a PSG layer on the polysilicon layer;
   patterning the PSG layer and polysilicon layer;
   depositing a protective oxide layer prior to releasing the structure.

* * * * *

UNITED STATES PATENT AND TRADEMARK OFFICE
CERTIFICATE OF CORRECTION

PATENT NO. : 6,506,620 B1  Page 1 of 1
DATED : January 14, 2003
INVENTOR(S) : Scharf et al.

It is certified that error appears in the above-identified patent and that said Letters Patent is hereby corrected as shown below:

<u>Title page,</u>
Item [75], Inventors, please insert -- Alex T. Tran, Ithaca, NY (US) --.

Signed and Sealed this

Eighth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,506,620 B1
DATED : January 14, 2003
INVENTOR(S) : Scharf et al.

It is certified that error appears in the above-identified patent and that said Letters Patent is hereby corrected as shown below:

<u>Title page,</u>
Item [75], Inventors, please insert -- Alex T. Tran, Ithaca, NY (US) --.

Signed and Sealed this

Fifteenth Day of June, 2004

JON W. DUDAS
*Acting Director of the United States Patent and Trademark Office*

UNITED STATES PATENT AND TRADEMARK OFFICE
CERTIFICATE OF CORRECTION

| | |
|---|---|
| PATENT NO. | : 6,506,620 B1 |
| APPLICATION NO. | : 09/724515 |
| DATED | : January 14, 2003 |
| INVENTOR(S) | : Bruce R. Scharf et al. |

It is certified that error appears in the above-identified patent and that said Letters Patent is hereby corrected as shown below:

Column 1, line 5, insert as a new paragraph:

This invention was made with Government support under 70NANB8H4014 awarded by NIST. The Government has certain rights in this invention.

Signed and Sealed this

Twenty-second Day of May, 2007

JON W. DUDAS
*Director of the United States Patent and Trademark Office*